(12) United States Patent
Jang et al.

(10) Patent No.: US 10,672,714 B2
(45) Date of Patent: Jun. 2, 2020

(54) FAN-OUT SEMICONDUCTOR PACKAGE

(71) Applicant: SAMSUNG ELECTRONICS CO., LTD., Suwon-si (KR)

(72) Inventors: Min Sek Jang, Suwon-si (KR); Sang Jin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/928,845

(22) Filed: Mar. 22, 2018

(65) Prior Publication Data

US 2019/0164894 A1 May 30, 2019

(30) Foreign Application Priority Data

Nov. 28, 2017 (KR) .................. 10-2017-0160830

(51) Int. Cl.
*H01L 23/538* (2006.01)
*H01L 23/31* (2006.01)
(Continued)

(52) U.S. Cl.
CPC ...... *H01L 23/5389* (2013.01); *H01L 23/3114* (2013.01); *H01L 23/3128* (2013.01);
(Continued)

(58) Field of Classification Search
CPC ............ H01L 23/5389; H01L 23/3114; H01L 23/5383; H01L 23/5386; H01L 24/20;
(Continued)

(56) References Cited

U.S. PATENT DOCUMENTS 6,396,148 B1 5/2002 Eichelberger et al.
9,728,415 B2 8/2017 Chockanathan et al.
(Continued)

FOREIGN PATENT DOCUMENTS

KR 10-0567225 B1 4/2006
KR 10-2009-0019182 A 2/2009
(Continued)

OTHER PUBLICATIONS

Office Action issued in Taiwanese Office Action No. 107111434 dated Oct. 30, 2018, with English translation.
Office Action issued in corresponding Korean Patent Application No. 10-2017-0160830, dated Aug. 21, 2018.
Communication dated Jun. 21, 2019, issued by the Taiwan Patent Office in counterpart Taiwanese Application No. 107111434.

*Primary Examiner* — Shahed Ahmed
(74) *Attorney, Agent, or Firm* — Sughrue Mion, PLLC

(57) ABSTRACT

A fan-out semiconductor package includes: a first semiconductor chip having an active surface having first connection pads disposed thereon and an inactive surface opposing the active surface; a second semiconductor chip having an active surface having second connection pads disposed thereon and an inactive surface opposing the active surface; an encapsulant encapsulating at least portions of each of the first and second semiconductor chips; and a connection member disposed on the active surface of each of the first and second semiconductor chips and including a redistribution layer electrically connected to the first and second connection pads, wherein the first and second semiconductor chips are physically integrated with each other, and the first and second semiconductor chips have internal circuits, respectively.

17 Claims, 15 Drawing Sheets

(51) Int. Cl.
*H01L 23/00* (2006.01)
*H01L 25/065* (2006.01)

(52) U.S. Cl.
CPC ...... *H01L 23/5383* (2013.01); *H01L 23/5386* (2013.01); *H01L 24/19* (2013.01); *H01L 24/20* (2013.01); *H01L 25/0655* (2013.01); *H01L 2224/13101* (2013.01); *H01L 2224/214* (2013.01); *H01L 2224/73204* (2013.01); *H01L 2924/1431* (2013.01); *H01L 2924/1433* (2013.01); *H01L 2924/1436* (2013.01); *H01L 2924/15311* (2013.01); *H01L 2924/181* (2013.01); *H01L 2924/18162* (2013.01); *H01L 2924/19105* (2013.01); *H01L 2924/3511* (2013.01)

(58) Field of Classification Search
CPC ..... H01L 2224/214; H01L 2924/19105; H01L 25/042; H01L 25/0655; H01L 25/072; H01L 25/0753; H01L 25/115; H01L 23/28–3192; H01L 21/56–568; H01L 2924/181–186
See application file for complete search history.

(56) References Cited

U.S. PATENT DOCUMENTS

| | | |
|---|---|---|
| 2003/0011068 A1 | 1/2003 | Song et al. |
| 2003/0134450 A1 | 7/2003 | Lee |
| 2006/0220210 A1 | 10/2006 | Karnezos et al. |
| 2007/0152327 A1 | 7/2007 | Chia et al. |
| 2009/0051030 A1 | 2/2009 | Yang et al. |
| 2009/0127686 A1 | 5/2009 | Yang et al. |
| 2012/0228719 A1* | 9/2012 | Harada ............... H01L 27/0629 257/E27.016 |
| 2017/0103951 A1 | 4/2017 | Lee et al. |
| 2017/0110413 A1* | 4/2017 | Chen ................... H01L 21/3205 |
| 2017/0309571 A1* | 10/2017 | Yi ....................... H01L 23/5389 |
| 2017/0318616 A1* | 11/2017 | Yu ......................... H04W 76/14 |

FOREIGN PATENT DOCUMENTS

| | | |
|---|---|---|
| KR | 10-2017-0043440 A | 4/2017 |
| KR | 10-2017-0121671 A | 11/2017 |

* cited by examiner

FAN-OUT SEMICONDUCTOR PACKAGE

CROSS-REFERENCE TO RELATED APPLICATION(S)

This application claims the benefit of priority to Korean Patent Application No. 10-2017-0160830 filed on Nov. 28, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of package technology suggested to satisfy the technical demand as described above is a fan-out package. Such a fan-out package has a compact size and may allow a plurality of pins to be implemented by redistributing electrical connection structures outwardly of a region in which a semiconductor chip is disposed.

SUMMARY

An aspect of the present disclosure may provide a fan-out semiconductor package in which the number of processes may be reduced, a mounting precision and a matching property may be improved, a size of a product may be reduced, and a bleeding defect of connection pads due to an encapsulant may be suppressed.

According to an aspect of the present disclosure, a fan-out semiconductor package may be provided, in which first and second semiconductor chips having internal circuits, respectively, are packaged together in a single package in a state in which they are not diced by a dicing processor, or the like, that is, a state in which they are physically integrated with each other.

According to an aspect of the present disclosure, a fan-out semiconductor package may include: a first semiconductor chip having an active surface having first connection pads disposed thereon and an inactive surface opposing the active surface; a second semiconductor chip having an active surface having second connection pads disposed thereon and an inactive surface opposing the active surface; an encapsulant encapsulating at least portions of each of the first and second semiconductor chips; and a connection member disposed on the active surface of each of the first and second semiconductor chips and including a redistribution layer electrically connected to the first and second connection pads, wherein the first and second semiconductor chips are physically integrated with each other, and the first and second semiconductor chips have internal circuits, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
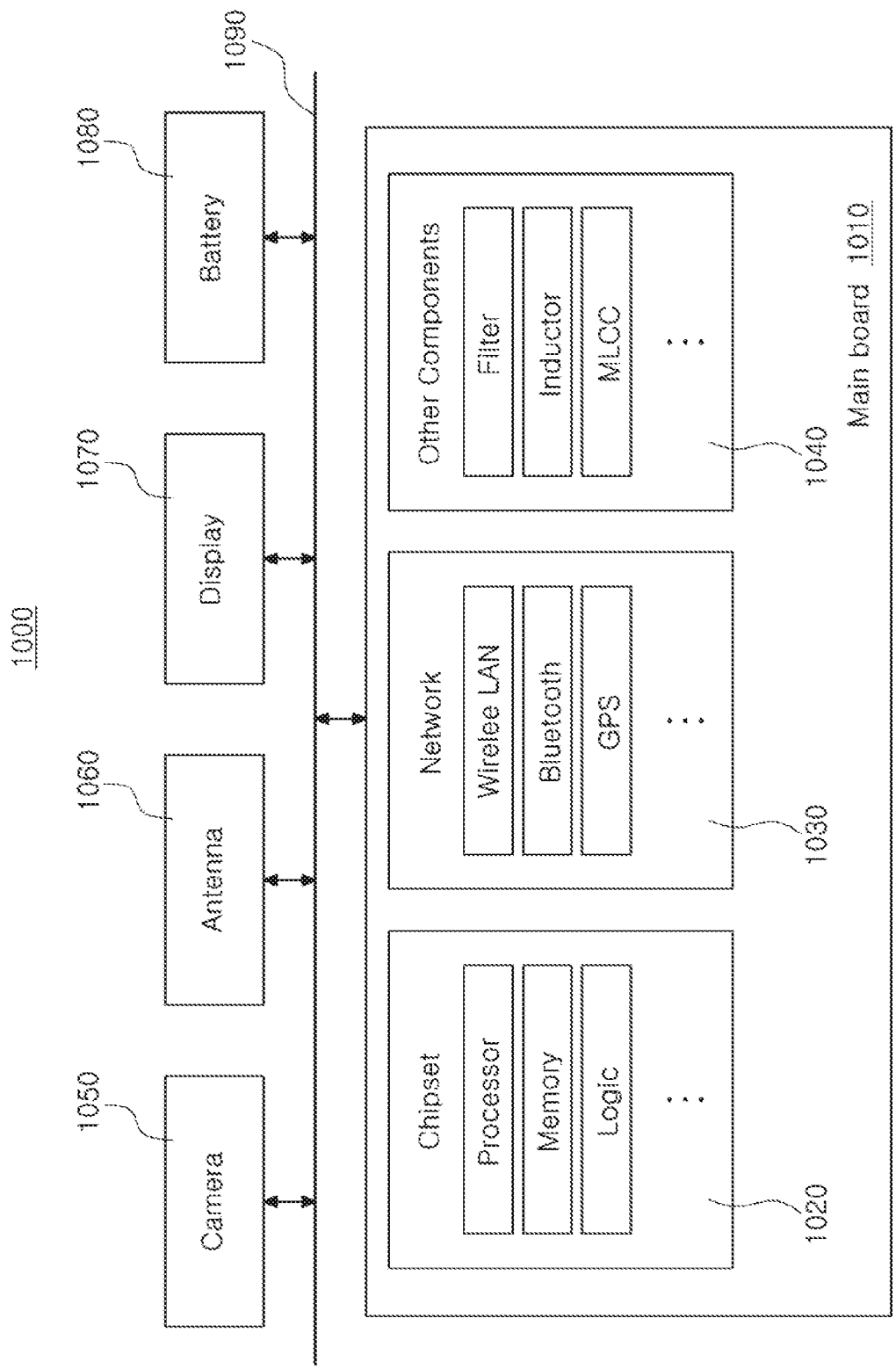
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
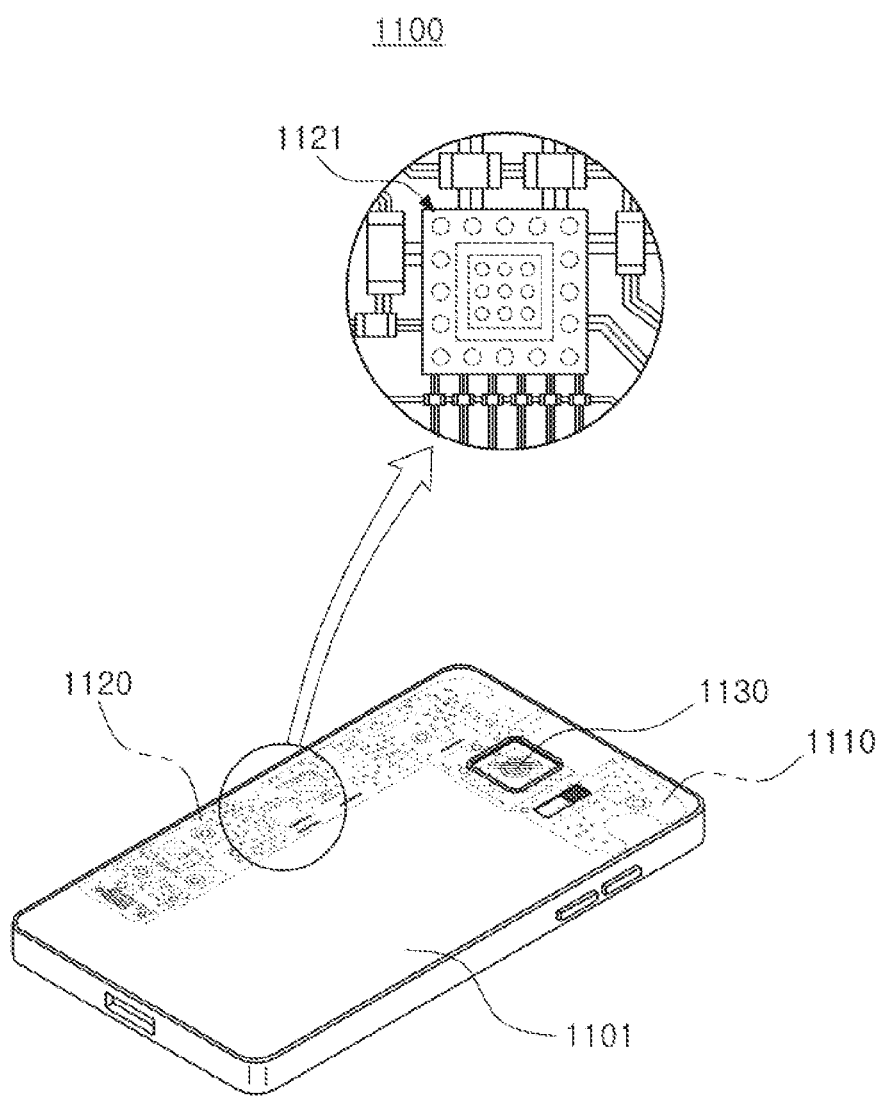
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard may be desirable.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described hereinafter in more detail with reference to the drawings.

Fan-in Semiconductor Package

Figure 3B:
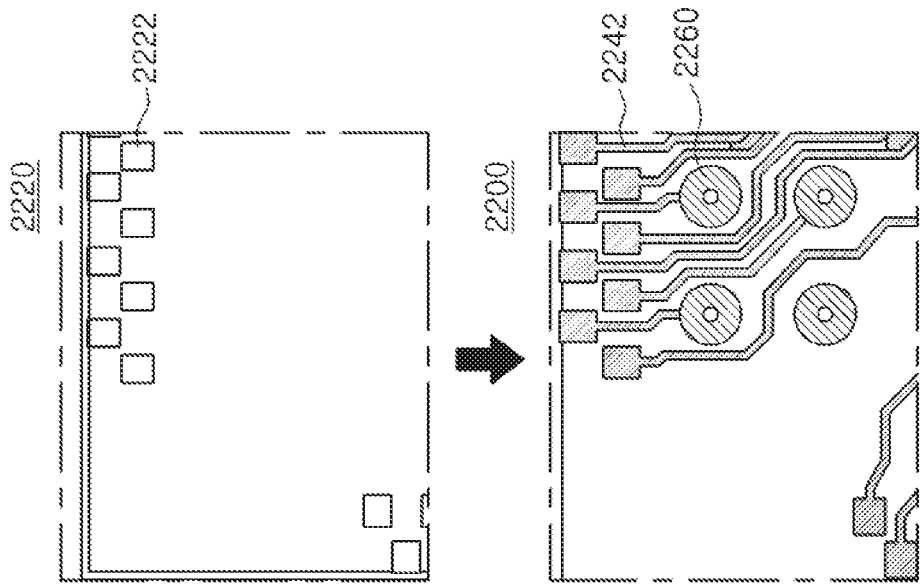
FIGS. 3A and 3B are schematic cross-sectional views illustrating states of a fan-in semiconductor package before and after being packaged.
Figure 3A:
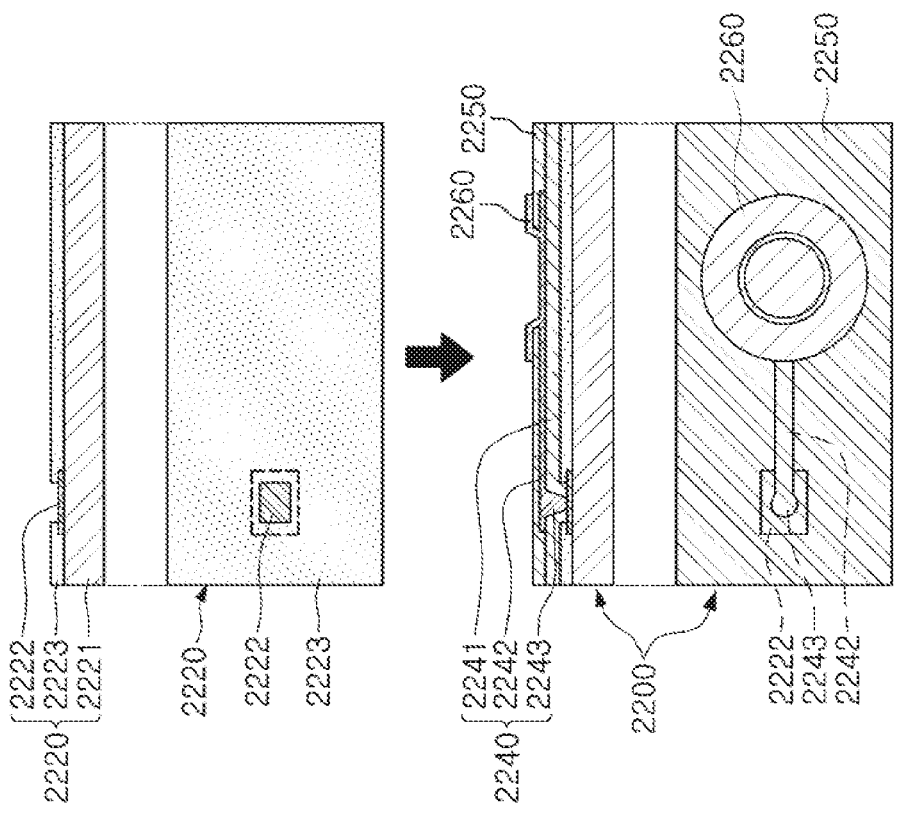

FIGS. 3A and 3B are schematic cross-sectional views illustrating states of a fan-in semiconductor package before and after being packaged.

Figure 4:
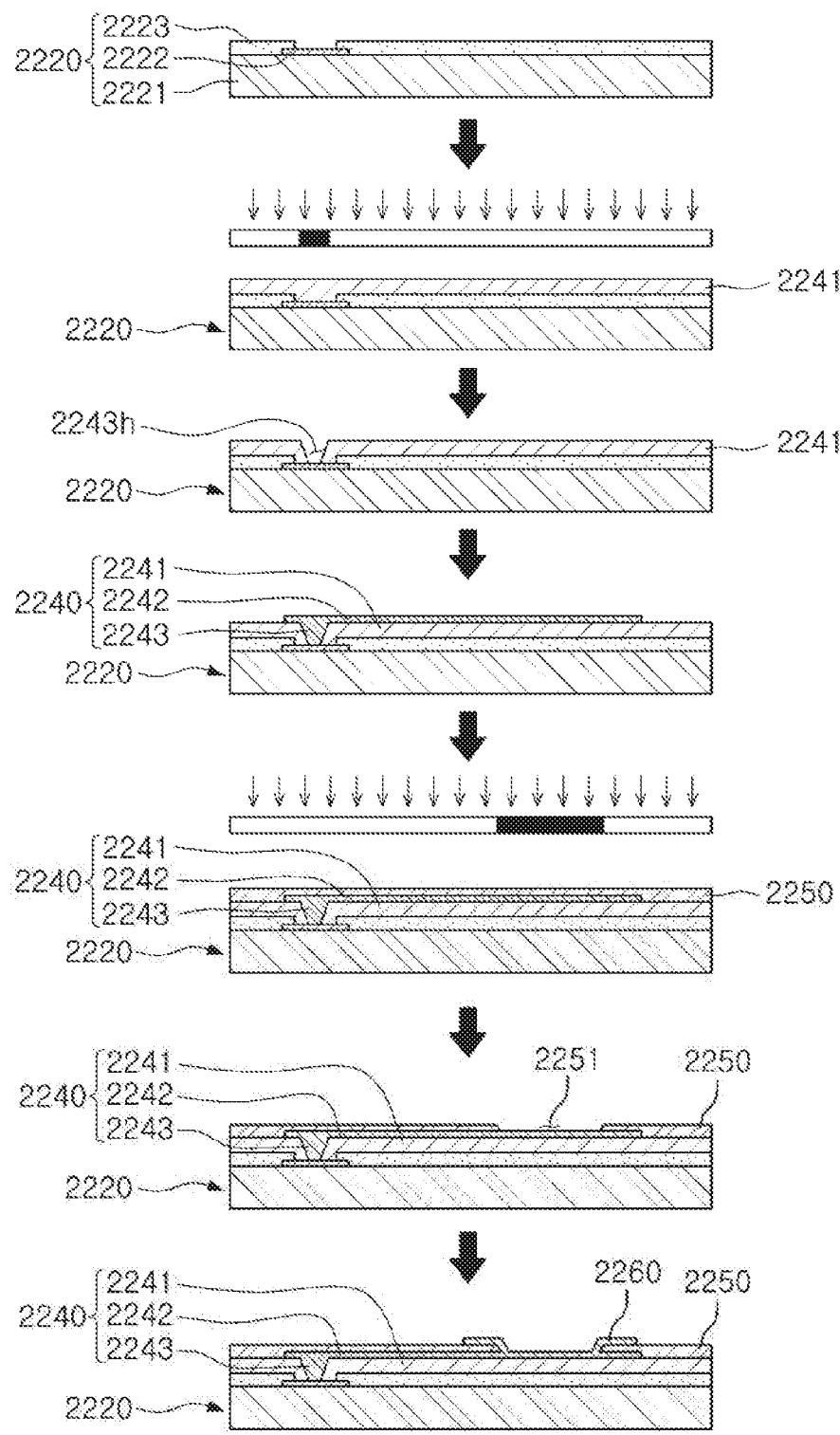
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243*h* opening the connection pads 2222, and then forming a redistribution layer 2242 and vias 2243. Then, a passivation layer 2250 protecting the connection member 2240 may be formed, an opening 2251 may be formed, and an under-bump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
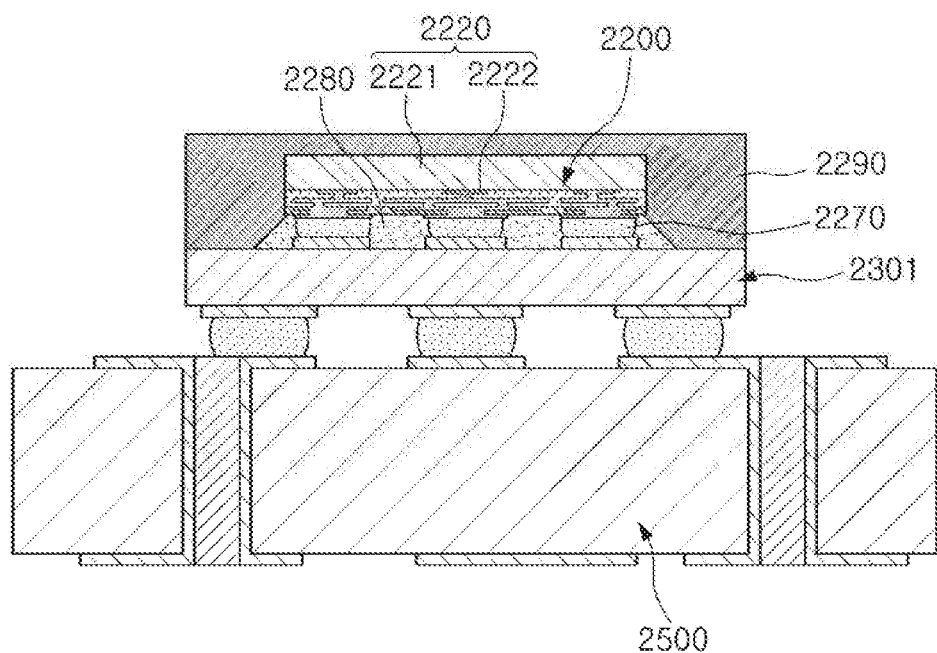
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
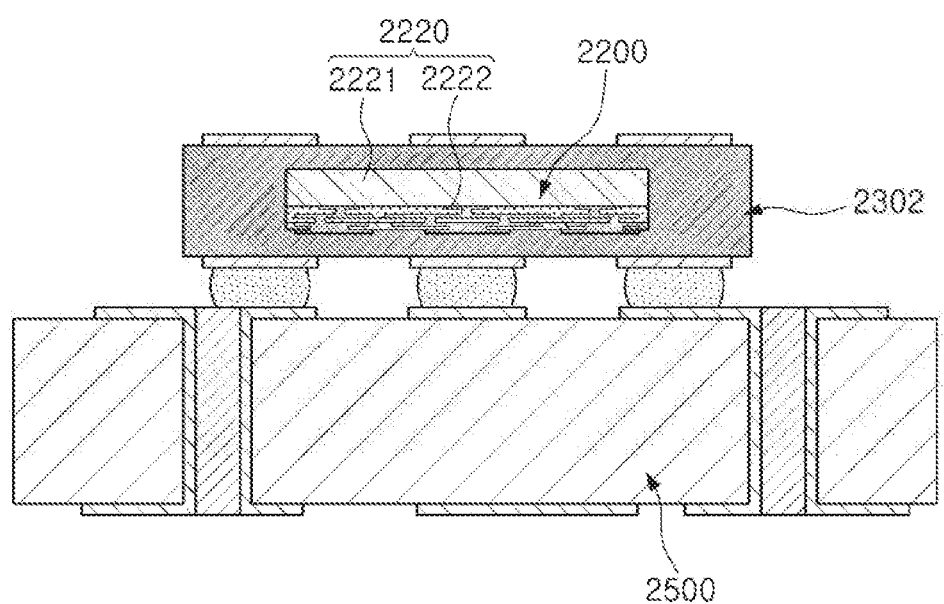
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-out Semiconductor Package

Figure 7:
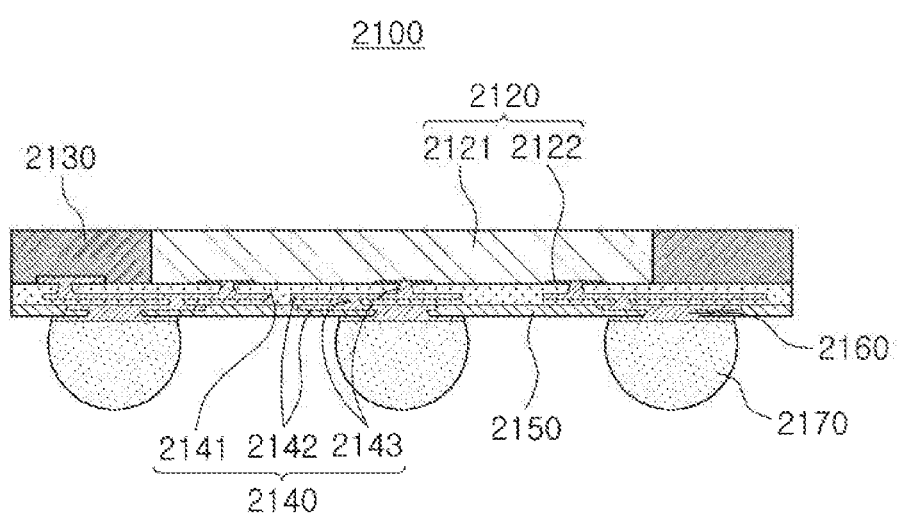
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
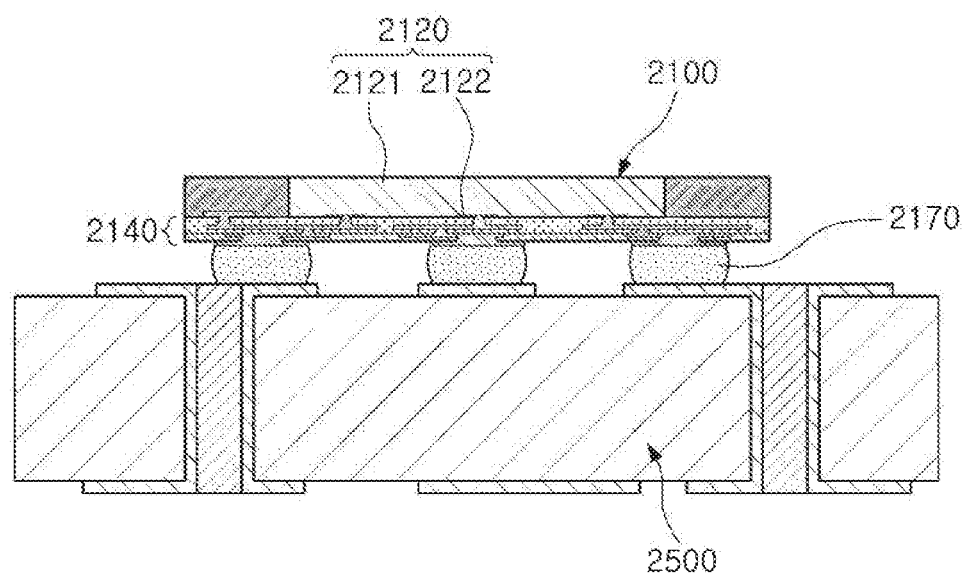
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is conceptually different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package in which the number of processes may be reduced, a mounting precision and a matching property may be improved, a size of a product may be reduced, and a bleeding defect of connection pads due to an encapsulant may be suppressed will be described hereinafter with reference to the drawings.

Figure 9:
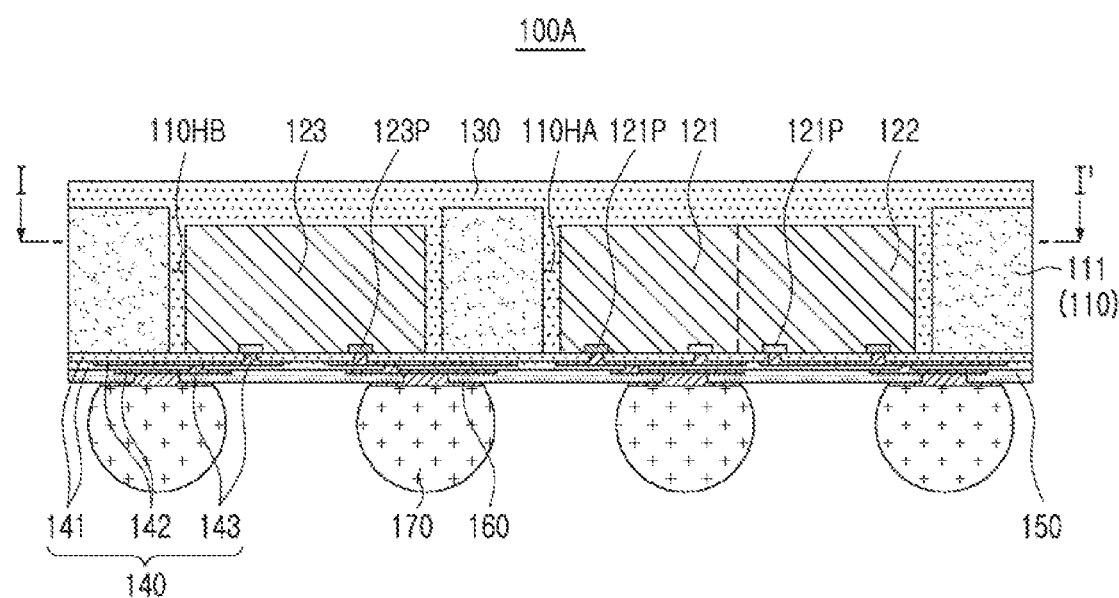
FIG. 9 is a schematic cross-sectional view illustrating an example of a fan-out semiconductor package.

FIG. 9 is a schematic cross-sectional view illustrating an example of a fan-out semiconductor package.

Figure 10:
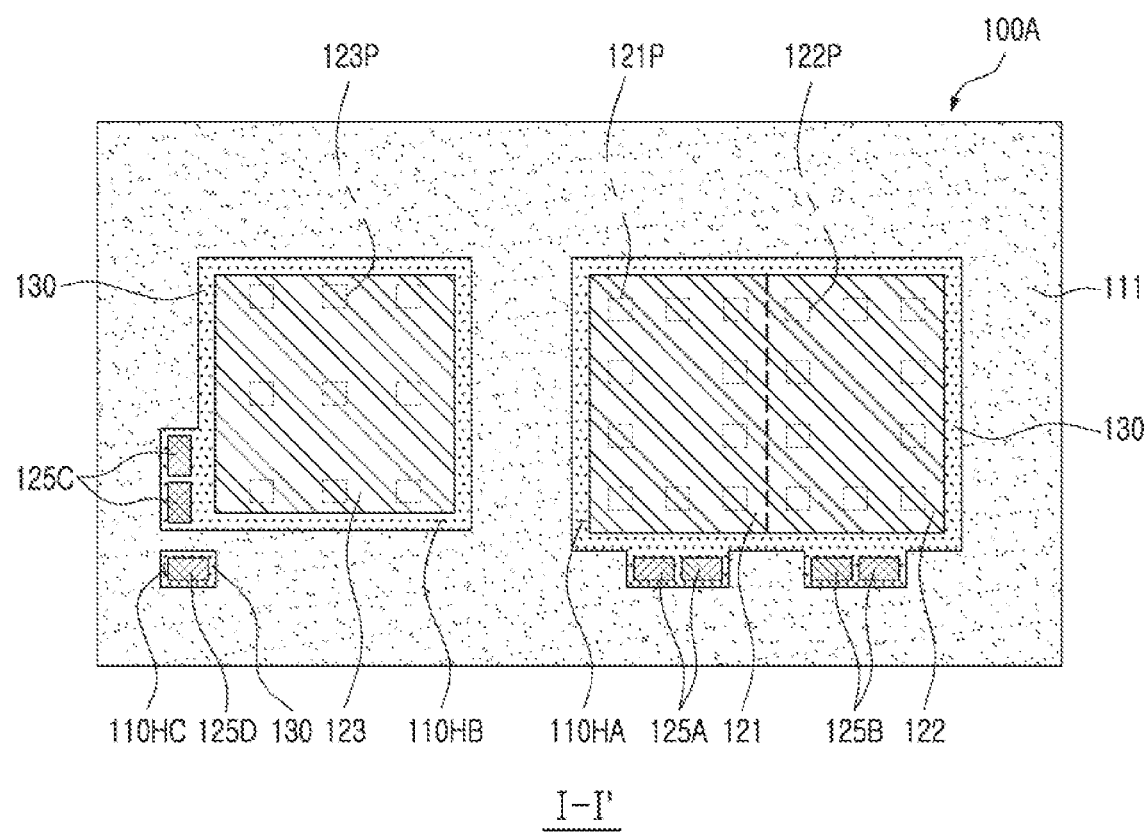
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Figure 11:
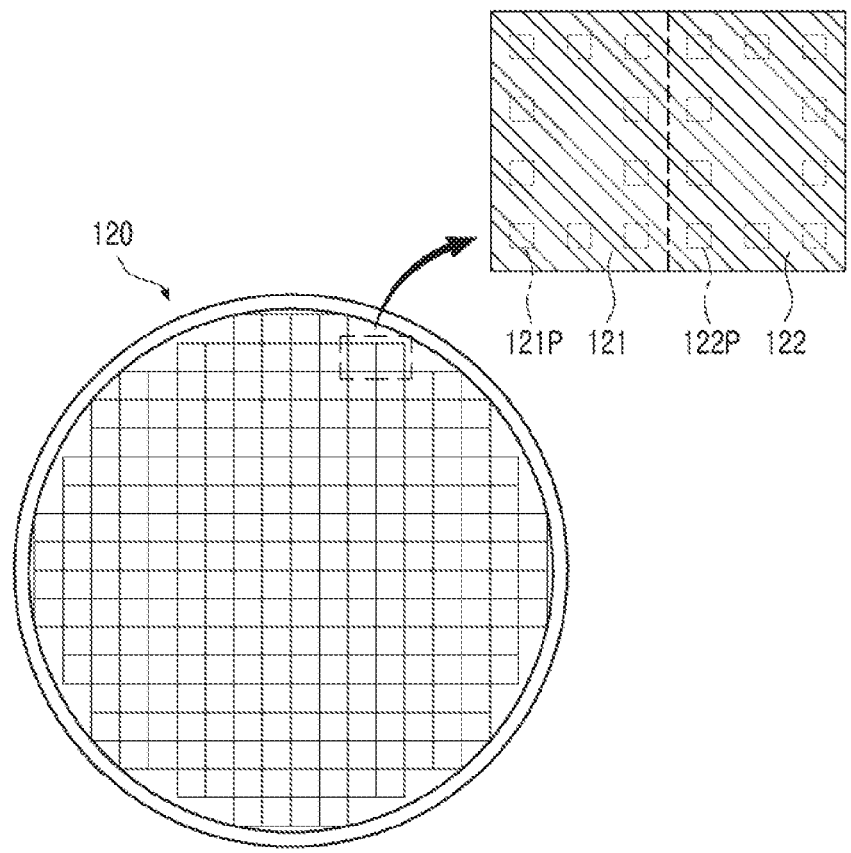
FIG. 11 is a schematic plan view illustrating forms, on a wafer, of first and second semiconductor chips used in the fan-out semiconductor chip of FIG. 9.

FIG. 11 is a schematic plan view illustrating forms, on a wafer, of first and second semiconductor chips used in the fan-out semiconductor chip of FIG. 9.

Referring to FIGS. 9 through 11, a fan-out semiconductor package 100A according to an exemplary embodiment in the present disclosure may include a core member 110 having first and second through-holes 110HA and 110HB spaced apart from each other, a first semiconductor chip 121 disposed in the first through-hole 110HA and having an active surface having first connection pads 121P disposed thereon and an inactive surface opposing the active surface, a second semiconductor chip 122 disposed in the first through-hole 110HA and having an active surface having first connection pads 122P disposed thereon and an inactive surface opposing the active surface, a third semiconductor chip 123 disposed in the second through-hole 110HB and an active surface having third connection pads 123P disposed thereon and an inactive surface opposing the active surface, a connection member 140 disposed on the core member 110 and the active surfaces of the first to third semiconductor chips 121, 122, and 123 and including a redistribution layer 142 electrically connected to the first, second and third semiconductor chips 121, 122, and 123, a passivation layer 150 disposed on the connection member 140, an underbump metal layer 160 disposed in openings of the passivation layer 150, and electrical connection structures 170 disposed on the underbump metal layer 160. One or more first and second passive components 125A and 125B and third passive components 125C may be further disposed in the first and second through-holes 110HA and 110HB, respectively. The core member 110 may further have a third through-hole 110HC, and one or more fourth passive components 125D may be disposed in the third through-hole 110HC.

In the fan-out semiconductor package 100A according to an exemplary embodiment, the first and second semiconductor chips 121 and 122 may be physically integrated with each other and be disposed in the first through-hole 110HA of the core member 110. That is, as illustrated by way of example in FIG. 11, the first and second semiconductor chips 121 and 122, which are the same kind of integrated circuits formed on a wafer, may be prepared in a state in which they are not diced, and may be disposed together in the first through-hole 110HA. In this case, it is sufficient that only one first through-hole 110HA is formed, and the number of processes may thus be reduced, and the first and second semiconductor chips 121 and 122 are disposed in a state in which they are integrated with each other, and a precision may be improved. In addition, a matching property between the first and second connection pads 121P and 122P of the first and second semiconductor chips 121 and 122 and vias 143 of the connection member 140 may be further improved. Partition walls of the core member 110 do not exist between the first and second semiconductor chips 121 and 122, and damage to the partition walls may thus be prevented. Meanwhile, when an encapsulant 130 is formed, it is likely that a bleeding defect in which a material of the encapsulant 130 bleeds into connection pads disposed in the vicinity of the partition walls of the core member 110 to pollute the connection pads will occur. On the other hand, in an exemplary embodiment, the first and second semiconductor chips 121 and 122 are integrated with each other, and the first and second connection pads 121P and 122P formed along a boundary between the first and second semiconductor chips 121 and 122, that is, connection pads disposed at a central portion of the entirety of the first and second semiconductor chips 121 and 122 integrated with each other are thus spaced apart from the partition walls, such that it is unlikely that bleeding will occur. Resultantly, the bleeding defect may be reduced as compared to a case in which the first and second semiconductor chips 121 and 122 are disposed in separate through-holes, respectively. In addition, the first and second semiconductor chips 121 and 122 are integrated with each other, and a distance between the first and second semiconductor chips 121 and 122 may thus be significantly reduced. Resultantly, an electrical path between the first and second connection pads 121P and 122P may also be significantly reduced.

Meanwhile, in the fan-out semiconductor package 100A according to an exemplary embodiment, the core member 110 may have the second through-hole 110HB separately from the first through-hole 110HA, as described above, and an integrated circuit (IC) of which a kind is different from that of first and second semiconductor chips 121 and 122 may be disposed in the second through-hole 110HB. For example, the first and second semiconductor chips 121 and 122 may be the same kind of ICs for a memory, and the third semiconductor chip 123 may be an IC for an application processor (AP) electrically connected to the ICs for a memory through the redistribution layer 142. In this case, the memory and the AP are electrically connected to each other in a side-by-side form, and an electrical path may thus be significantly reduced. In addition, the first and second passive components 125A and 125B and the third passive components 125C electrically connected to the first and second connection pads 121P and 122P and the third connection pads 123P through the redistribution layer 142 may be disposed in the first and second through-holes 110HA and 110HB, respectively, and the fan-out semiconductor package 100A according to an exemplary embodiment may be miniaturized and the electrical path may be significantly reduced, through an integrated disposition. In addition, various designs are possible by further forming the third through-hole 110HC in the core member 110 and further disposing the fourth passive components 125D in the third through-hole 110HC.

The respective components included in the fan-out semiconductor package 100A according to an exemplary embodiment will be described hereinafter in more detail.

The core member 110 may improve rigidity of the fan-out semiconductor package 100A depending on certain materials, and serve to secure uniformity of a thickness of the encapsulant 130. When through-wirings, or the like, are formed in the core member 110, the fan-out semiconductor package 100A may be utilized as a package-on-package (POP) type package. The core member 110 may have the first to third through-holes 110HA, 110HB, and 110HC. The first and second semiconductor chips 121 and 122 and the first and second passive components 125A and 125B may be disposed in the first through-hole 110HA to be spaced apart from the core member 110 by predetermined distances. The third semiconductor chip 123 and the third passive components 125C may be disposed in the second through-hole 110HB to be spaced apart from the core member 110 by predetermined distances. The fourth passive components 125D may be disposed in the third through-hole 110HC to be spaced apart from the core member 110 by predetermined distances. The core member 110 may be omitted, if necessary, but it may be preferable in terms of implementation of an effect intended by the present disclosure that the fan-out semiconductor package 100A has the core member 110. Meanwhile, some or all of the second and third through-holes 110HB and 110HC, the third semiconductor chip 123, and the first to third passive components 125A, 125B, and 125C may be omitted, if necessary.

The core member 110 may include an insulating layer 111. An insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Buildup Film (ABF), FR-4, Bismaleimide Triazine (BT), or the like.

Each of the first and second semiconductor chips 121 and 122 may be an integrated circuit (IC) provided in an amount of several hundreds to several millions of elements or more integrated in a single chip. In this case, the IC may be an IC for a memory, such as a volatile memory (for example, a DRAM), a non-volatile memory (for example, a ROM), a flash memory, or the like. The first and second semiconductor chips 121 and 122 may be formed on the basis of a wafer. In this case, a base material of each of bodies of the first and second semiconductor chips 121 and 122 may be silicon (Si), germanium (Ge), gallium arsenide (GaAs), or the like. Various internal circuits may be formed on each of the bodies, and the internal circuits of the first and second semiconductor chips 121 and 122 may have the same design. That is, the first and second semiconductor chips 121 and 122 may be the same kind of ICs for a memory. The internal circuits of the first and second semiconductor chips 121 and 122 themselves may be electrically insulated from each other, and the first and second connection pads 121P and 122P of the first and second semiconductor chips 121 and 122 may be electrically connected to each other through the redistribution layer 142, such that the internal circuits of the first and second semiconductor chips 121 and 122 may be electrically connected to each other. The first and second connection pads 121P and 122P may electrically connect the first and second semiconductor chips 121 and 122 to other components. A material of each of the first and second connection pads 121P and 122P may be a conductive material such as aluminum (Al), or the like. In this case, the first and second semiconductor chips 121 and 122, which are the same kind of semiconductors, may be manufactured by the same process, and a disposition form of the first connection pads 121P on the active surface of the first semiconductor chip 121 may be the same as that of the second connection pads 122P on the active surface of the second semiconductor chip 122. A passivation layer (not illustrated) exposing each of the first and second connection pads 121P and 122P may be formed on each of the bodies, and may be an oxide film, a nitride film, or the like, or a double layer of an oxide layer and a nitride layer. An insulating layer (not illustrated), and the like, may also be further disposed in other required positions. Each of the first and second semiconductor chips 121 and 122 may be a bare die, but a redistribution layer (not illustrated) may further be formed on each of the active surfaces of the first and second semiconductor chips 121 and 122, if necessary.

The third semiconductor chip 123 may be an IC provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. The third semiconductor chip 123 may be formed on the basis of a wafer. In this case, a base material of a body of the third semiconductor chip 123 may be silicon (Si), germanium (Ge), gallium arsenide (GaAs), or the like. Various internal circuits may be formed on the body. The third connection pads 123P may electrically connect the third semiconductor chip 123 to other components, and a conductive material such as aluminum (Al), or the like, may be used as a material of each of the third connection pads 123P. A passivation layer (not illustrated) exposing the third connection pads 123P may be formed on the body, and may be an oxide film, a nitride film, or the like, or a double layer of an oxide layer and a nitride layer. An insulating layer (not illustrated), and the like, may also be further disposed in other required positions. The third semiconductor chip 123 may be a bare die, but a redistribution layer (not illustrated) may further be formed on the active surface of the third semiconductor chip 123, if necessary.

Each of the numbers of first to fourth passive components 125A, 125B, 125C, and 125D may be one or plural, and the first to fourth passive components 125A, 125B, 125C, and 125D may be any suitable passive components. For example, the first to fourth passive components 125A, 125B, 125C, and 125D may be resistor components such as capacitors, inductors, beads, or the like, but are not limited thereto. The first to fourth passive components 125A, 125B, 125C, and 125D may be electrically connected to the first to third connection pads 121P, 122P, and 123P of the first to third semiconductor chips 121, 122, and 123 through the redistribution layer 142. The numbers of first to fourth passive components 125A, 125B, 125C, and 125D may be more than or less than those illustrated in the drawings.

The encapsulant 130 may protect the core member 110, the semiconductor chips 121, 122, and 123, the passive components 125A, 125B, 125C, and 125D, and the like. An encapsulation form of the encapsulant 130 is not particularly limited, and may be a form in which the encapsulant 130 surrounds at least portions of the core member 110, the semiconductor chips 121, 122, and 123, the passive components 125A, 125B, 125C, and 125D, and the like. For example, the encapsulant 130 may cover the core member 110, the inactive surfaces of the semiconductor chips 121, 122, and 123, and the passive components 125A, 125B, 125C, and 125D, and may fill at least portions of each of the through-holes 110HA, 110HB, and 110HC.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The connection member 140 may be configured to redistribute the connection pads 121P, 122P, and 123P of the semiconductor chips 121, 122, and 123. Several tens to several hundreds of connection pads 121P, 122P, and 123P having various functions may be redistributed by the connection member 140, and may be physically or electrically externally connected through electrical connection structures 170 to be described below depending on the functions. In addition, the connection pads 121P, 122P, and 123P may be electrically connected to each other, and may also be electrically connected to the passive components 125A, 125B, 125D, and 125D. The connection member 140 may include insulating layers 141, redistribution layers 142 disposed on the insulating layers 141, and the vias 143 penetrating through the insulating layers 141 and connecting the redistribution layers 142 to each other. In the fan-out semiconductor package 100A according to the exemplary embodiment, the connection member 140 may include a plurality of redistribution layers 142, but is not limited thereto. That is, the connection member 140 may also include a single layer. In addition, the connection member 140 may also include different numbers of layers.

A material of each of the insulating layers 141 may be an insulating material. In this case, a photosensitive insulating material such as a PID resin may also be used as the insulating material. In this case, the insulating layers 141 may be formed to have a smaller thickness, and a fine pitch of the vias 143 may be achieved more easily. The materials of the insulating layers 141 may be the same as each other or may be different from each other, if necessary. The insulating layers 141 may be integrated with each other depending on processes, so that a boundary therebetween may not be readily apparent.

The redistribution layers 142 may serve to substantially redistribute the connection pads 121P, 122P, and 123P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, electrical connection structures pads, and the like.

A surface treatment layer (not illustrated) may further be formed on portions of the redistribution layer 142 exposed from the redistribution layers 142, if necessary. The surface treatment layer (not illustrated) is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 143 may electrically connect the redistribution layers 142, the connection pads 121P, 122P, and 123P, the passive components 125A, 125B, 125C, and 125D, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, each of the vias 143 may have a tapered shape, or the like.

The passivation layer 150 may be additionally configured to protect the connection member 140 from external physical or chemical impacts. The passivation layer 150 may have the openings exposing at least portions of some of the redistribution layers 142 of the connection member 140. The openings may expose the entirety or only portions of a surface of the redistribution layer 142. A material of the passivation layer 150 is not particularly limited, and may be a photosensitive insulating material such as a PID resin. Alternatively, a solder resist may also be used as the material of the passivation layer 150. Alternatively, an insulating resin that does not include a core material, but includes a filler, for example, ABF including an inorganic filler and an epoxy resin may be used as the material of the passivation layer 150.

The underbump metal layer 160 may be additionally configured to improve connection reliability of the electrical connection structures 170 to improve board level reliability of the fan-out semiconductor package 100A. The underbump metal layer 160 may be disposed on walls in the openings of the passivation layer 150 and the exposed redistribution layer 142 of the connection member 140. The underbump metal layer 160 may be formed by the known metallization method using the known conductive material such as a metal.

The electrical connection structures 170 may be additionally configured to physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a low melting point metal, for example, a solder such as tin (Sn)-aluminum (Al)-copper (Cu) alloys, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, and may be sufficiently modified depending on design particulars by those skilled in the art. For example, the electrical connection structures 170 may be provided in an amount of several tens to several thousands according to the numbers of connection pads 121P, 122P, and 123P, or may be provided in an amount of several tens to several thousands or more or several tens to several thousands or less.

At least one of the electrical connection structures 170 may be disposed in a fan-out region. The fan-out region refers to a region except for a region in which the first to third semiconductor chips 121, 122, and 123 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Figure 12:
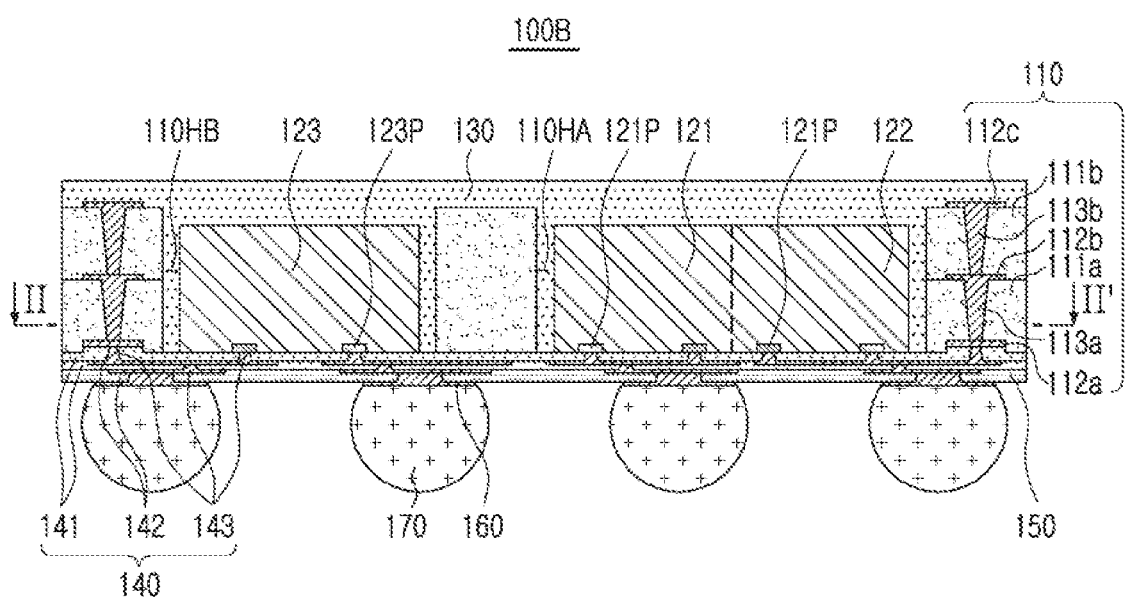
FIG. 12 is a schematic cross-sectional view illustrating another example of a fan-out semiconductor package.

FIG. 12 is a schematic cross-sectional view illustrating another example of a fan-out semiconductor package.

Figure 13:
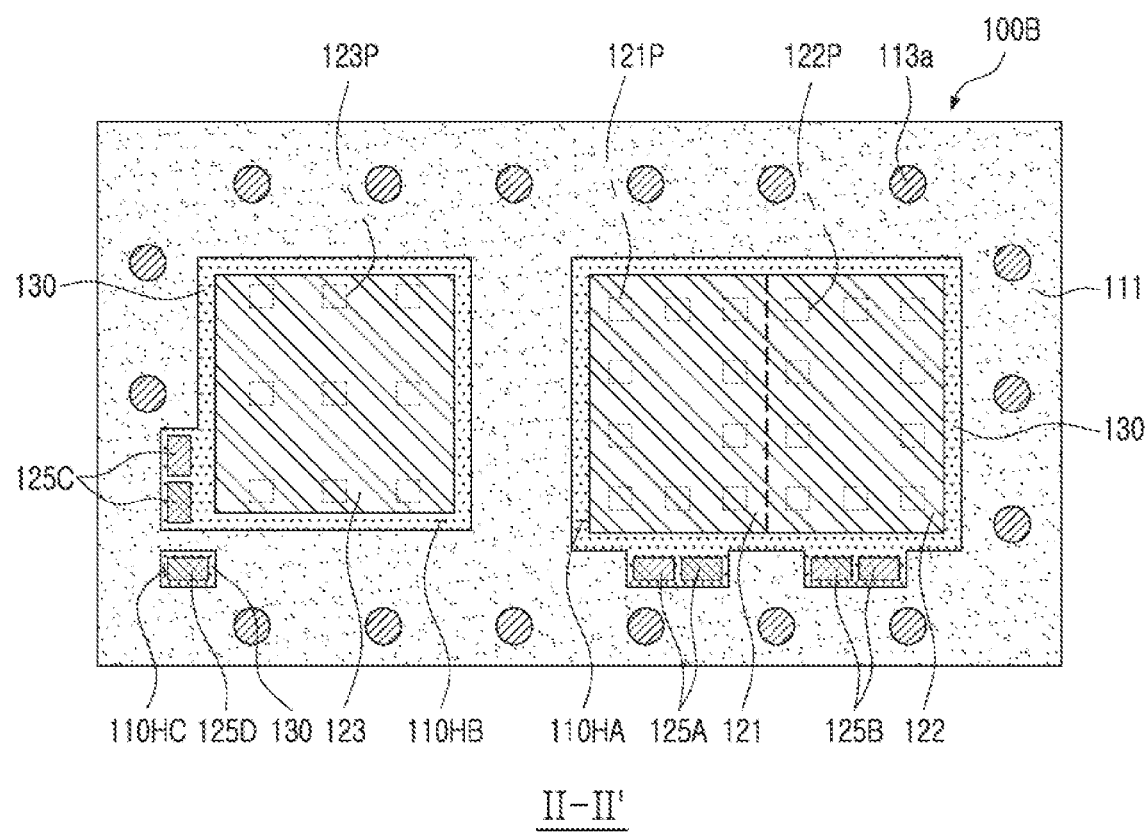
FIG. 13 is a schematic plan view taken along line II-II' of the fan-out semiconductor package of FIG. 13.

FIG. 13 is a schematic plan view taken along line II-II' of the fan-out semiconductor package of FIG. 13.

Referring to FIGS. 12 and 13, in a fan-out semiconductor package 100B according to another exemplary embodiment in the present disclosure, a core member 110 may include a first insulating layer 111a in contact with a connection member 140, a first wiring layer 112a in contact with the connection member 140 and embedded in the first insulating layer 111a, a second wiring layer 112b disposed on the other surface of the first insulating layer 111a opposing a surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first, second and third wiring layers 112a, 112b, and 112c may be electrically connected to connection pads 121P, 122P, and 123P. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection member 140 may thus become constant. That is, a difference between a distance from a redistribution layer 142 of the connection member 140 to a lower surface of the first insulating layer 111a and a distance from the redistribution layer 142 of the connection member 140 to the connection pads 121P, 122P, and 123P of first, second and third semiconductor chips 121, 122, and 123 may be smaller than a thickness of the first wiring layer 112a. Therefore, a high density wiring design of the connection member 140 may be accomplished.

A lower surface of the first wiring layer 112a of the core member 110 may be disposed on a level above a lower surface of each of the connection pads 121P, 122P, and 123P of first to third semiconductor chips 121, 122, and 123. In addition, a distance between the redistribution layer 142 of the connection member 140 and the first wiring layer 112a of the core member 110 may be greater than that between the redistribution layer 142 of the connection member 140 and each of the connection pads 121P, 122P, and 123P of first to third semiconductor chips 121, 122, and 123. The reason is that the first wiring layer 112a may be recessed into the first insulating layer 111a. As described above, when the first wiring layer 112a is recessed into the first insulating layer 111a, such that the lower surface of the first insulating layer 111a and the lower surface of the first wiring layer 112a have a step therebetween, a phenomenon in which a material of an encapsulant 130 bleeds to pollute the first wiring layer 112a may be prevented. The second wiring layer 112b of the core member 110 may be disposed on a level between active surfaces and inactive surfaces of the first to third semiconductor chips 121, 122, and 123. The core member 110 may be formed at a thickness corresponding to that of each of the first, second and third semiconductor chips 121, 122, and 123. Therefore, the second wiring layer 112b formed in the core member 110 may be disposed on the level between the active surfaces and the inactive surfaces of the first to third semiconductor chips 121, 122, and 123.

Thicknesses of the wiring layers 112a, 112b, and 112c of the core member 110 may be greater than those of the redistribution layers 142 of the connection member 140. Since the core member 110 may have a thickness equal to or greater than that of each of the first, second and third semiconductor chips 121, 122, and 123, the wiring layers 112a, 112b, and 112c may be formed at large sizes depending on a scale of the core member 110. On the other hand, the redistribution layers 142 of the connection member 140 may be formed at sizes relatively smaller than those of the wiring layers 112a, 112b, and 112c for thinness.

A material of each of the insulating layers 111a and 111b is not particularly limited. For example, an insulating material may be used as the material of each of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 121P, 122P, and 123P of first, second and third semiconductor chips 121, 122, and 123. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, electrical connection structure pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have all of the shapes known in the related art, such as a tapered shape, a cylindrical shape, and the like. When holes for the first vias 113a are formed, some of the pads of the first wiring layer 112a may serve as a stopper, and it may thus be advantageous in a process by each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process by each of the second vias 113b has the tapered shape of which a width of an upper surface is greater than that of a lower surface. In this case, the second vias 113b may be integrated with pad patterns of the third wiring layer 112c. A description of other configurations overlaps that described above, and is thus omitted.

Figure 14:
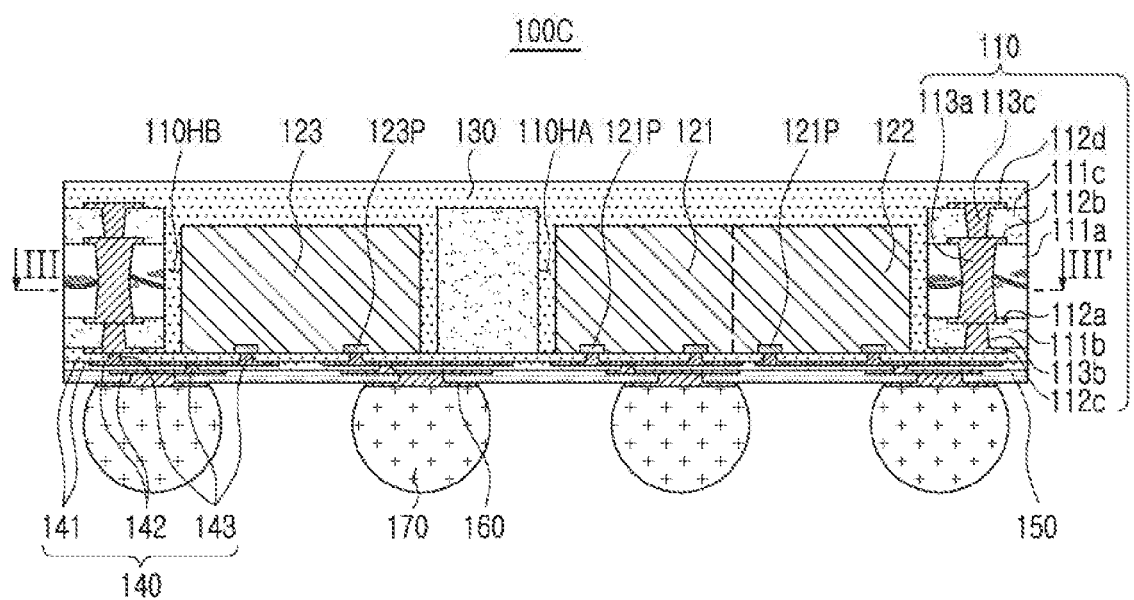
FIG. 14 is a schematic cross-sectional view illustrating another example of a fan-out semiconductor package.

FIG. 14 is a schematic cross-sectional view illustrating another example of a fan-out semiconductor package.

Figure 15:
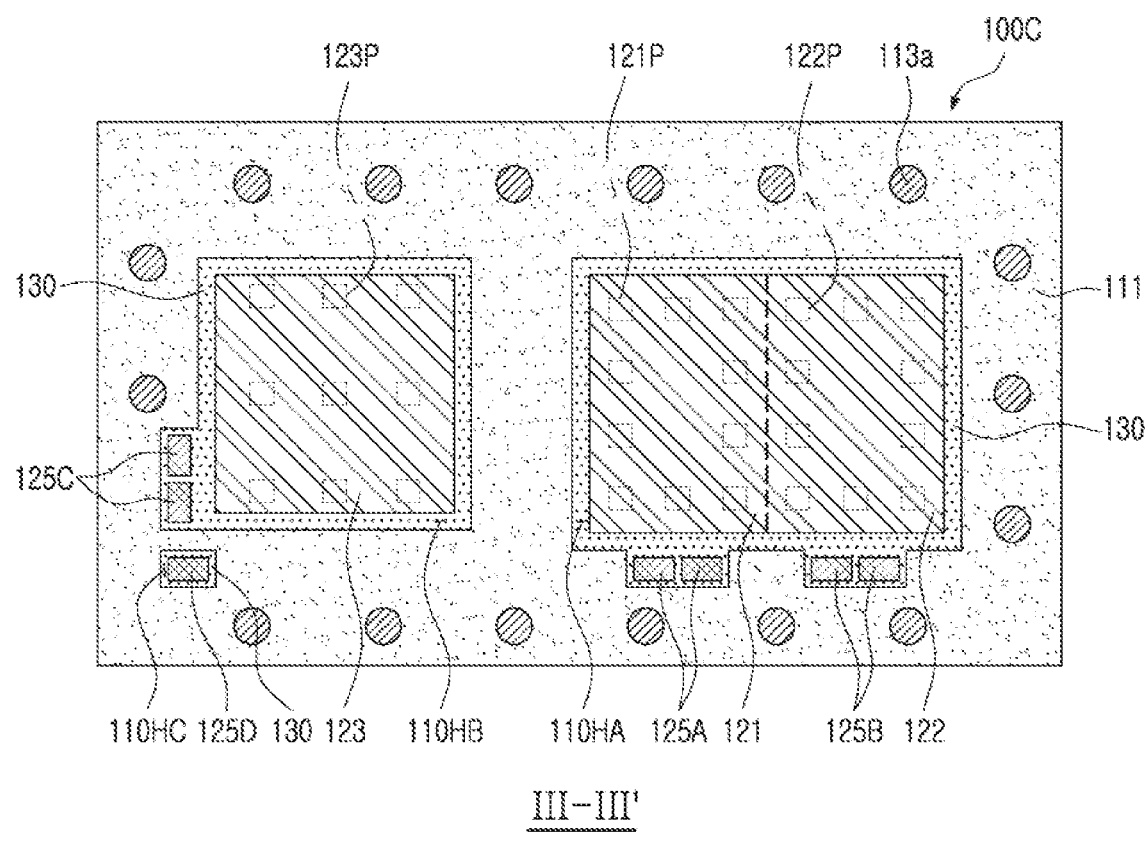
FIG. 15 is a schematic plan view taken along line of the fan-out semiconductor package of FIG. 14.

FIG. 15 is a schematic plan view taken along line of the fan-out semiconductor package of FIG. 14.

Referring to the drawing, in a fan-out semiconductor package 100C according to another exemplary embodiment in the present disclosure, a core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first, second, third and fourth wiring layers 112a, 112b, 112c, and 112d may be electrically connected to connection pads 121P, 122P, and 123P. Since the core member 110 may include a large number of wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first, second and third vias 113a, 113b, and 113c each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

A lower surface of the third wiring layer 112c of the core member 110 may be disposed on a level below a lower surface of each of the connection pads 121P, 122P, and 123P of first, second and third semiconductor chips 121, 122, and 123. In addition, a distance between a redistribution layer 142 of the connection member 140 and the third wiring layer 112c of the core member 110 may be smaller than that between the redistribution layer 142 of the connection member 140 and each of the connection pads 121P, 122P, and 123P of the first, second and third semiconductor chips 121, 122, and 123. The reason is that the third wiring layer 112c may be disposed on the second insulating layer 111b in protruding form, resulting in being in contact with the connection member 140. The first wiring layer 112a and the second wiring layer 112b of the core member 110 may be disposed on a level between active surfaces and inactive surfaces of the first, second and third semiconductor chips 121, 122, and 123. Since the core member 110 may be formed at a thickness corresponding to that of each of the first, second and third semiconductor chips 121, 122, and 123, the first wiring layer 112a and the second wiring layer 112b formed in the core member 110 may be disposed on the level between the active surfaces and the inactive surfaces of the first, second and third semiconductor chips 121, 122, and 123.

Thicknesses of the wiring layers 112a, 112b, 112c, and 112d of the core member 110 may be greater than those of the redistribution layers 142 of the connection member 140. Since the core member 110 may have a thickness equal to or greater than that of each of the first, second and third semiconductor chips 121, 122, and 123, the wiring layers 112a, 112b, 112c, and 112d may also be formed at large sizes. On the other hand, the redistribution layers 142 of the connection member 140 may be formed at relatively small sizes for thinness.

Other contents overlap those described above, and a detailed description thereof is thus omitted.

As set forth above, according to the exemplary embodiments in the present disclosure, a fan-out semiconductor package in which the number of processes may be reduced, a mounting precision and a matching property may be improved, a size of a product may be reduced, and a bleeding defect of connection pads due to an encapsulant may be suppressed may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a first semiconductor chip including:
   a first active surface having first connection pads disposed thereon; and
   a first inactive surface opposite to the first active surface;
a second semiconductor chip including:
   a second active surface having second connection pads disposed thereon; and
   a second inactive surface opposite to the second active surface;
an encapsulant encapsulating at least portions of each of the first semiconductor chip and the second semiconductor chip; and
a connection member disposed on the first active surface of the first semiconductor chip and disposed on the second active surface of the second semiconductor chip, the connection member including a redistribution layer electrically connected to the first connection pads and the second connection pads,
wherein the first semiconductor chip and the second semiconductor chip are physically integrated with each other by being in direct contact with each other,
wherein each of the first semiconductor chip and the second semiconductor chip has internal circuits, and
wherein some of each of the first connection pads and the second connection pads are disposed along a boundary between the first semiconductor chip and the second semiconductor chip.

2. The fan-out semiconductor package of claim 1, wherein the internal circuits of the first semiconductor chip and the internal circuits of the second semiconductor chip are the same.

3. The fan-out semiconductor package of claim 1, wherein the first semiconductor chip and the second semiconductor chip are the same kind of integrated circuits (ICs) for a memory.

4. The fan-out semiconductor package of claim 1, wherein a disposition form of the first connection pads on the first active surface of the first semiconductor chip is the same as that of the second connection pads on the second active surface of the second semiconductor chip.

5. The fan-out semiconductor package of claim 1, further comprising a core member having a first through-hole,
wherein the first semiconductor chip and the second semiconductor chip are disposed in the first through-hole, and
wherein the encapsulant fills at least portions of the first through-hole.

6. The fan-out semiconductor package of claim 5, further comprising one or more a first passive component and a second passive component disposed in the first through-hole,
wherein the first passive component and the second passive component are electrically connected to the first connection pads and the second connection pads through the redistribution layer.

7. The fan-out semiconductor package of claim 5, wherein the core member further has a second through-hole spaced apart from the first through-hole, a third semiconductor chip is disposed in the second through-hole, the third semiconductor chip having:
a third active surface having third connection pads disposed thereon; and
a third inactive surface opposite to the third active surface,
the encapsulant fills at least portions of the second through-hole, and
the third connection pads are electrically connected to the first connection pads and the second connection pads through the redistribution layer.

8. The fan-out semiconductor package of claim 7, further comprising one or more third passive components disposed in the second through-hole,
wherein the one or more third passive components are electrically connected to the third connection pads through the redistribution layer.

9. The fan-out semiconductor package of claim 7, wherein the first semiconductor chip and the second semiconductor chip are the same kind of ICs for a memory, and
the third semiconductor chip is an IC for an application processor (AP).

10. The fan-out semiconductor package of claim 5, wherein the core member includes:
a first insulating layer;
a first wiring layer in contact with the connection member and embedded in the first insulating layer; and a second wiring layer disposed on a second surface of the first insulating layer opposite to a first surface of the first insulating layer in which the first wiring layer is embedded, and wherein the first wiring layer and the second wiring layer are electrically connected to the first connection pads and the second connection pads.

11. The fan-out semiconductor package of claim 10, wherein a first lower surface of the first insulating layer has a step with respect to a second lower surface of the first wiring layer.

12. The fan-out semiconductor package of claim 5, wherein the core member includes a first insulating layer, a first wiring layer and a second wiring layer disposed on opposite surfaces of the first insulating layer, respectively, a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer, and the first to fourth wiring layers are electrically connected to the first connection pads and the second connection pads.

13. The fan-out semiconductor package of claim 12, wherein the first insulating layer has a thickness greater than those of the second insulating layer and the third insulating layer.

14. A fan-out semiconductor package comprising:

an insulating core member having a first through-hole;

a first semiconductor chip and a second semiconductor chip, each of the first semiconductor chip and the second semiconductor chip having an active surface with connection pads disposed thereon, the first semiconductor chip and the second semiconductor chip being disposed in the first through-hole and spaced apart from the insulating core member;

an encapsulant encapsulating at least portions of the first semiconductor chip and the second semiconductor chip and filling at least a portion of a space between the insulating core member and the first semiconductor chip and the second semiconductor chip in the first through-hole; and a connection member disposed on the insulating core member, the encapsulant, and the active surface of each of the first semiconductor chip and the second semiconductor chip, the connection member including a redistribution layer electrically connecting the connection pads of the first semiconductor chip and the second semiconductor chip, wherein the first semiconductor chip and the second semiconductor chip share a substrate and are separable along a boundary surface, the boundary surface being coplanar with each of the first semiconductor chip and the second semiconductor chip, and wherein each of the first semiconductor chip and the second semiconductor chip is configured to function independently based on the first semiconductor chip and the second semiconductor chip being separated from each other along the boundary surface.

15. The fan-out semiconductor package of claim 14, wherein the first semiconductor chip and the second semiconductor chip comprise unseparated dies of a wafer comprising a plurality of dies.

16. The fan-out semiconductor package of claim 14, further comprising a third semiconductor chip disposed in a second through-hole in the insulating core member, the second through-hole being spaced apart from the first through-hole.

17. The fan-out semiconductor package of claim 14, wherein the first semiconductor chip and the second semiconductor chip are in direct contact with each other and are separable along the boundary surface.

* * * * *